United States Patent
Lee

(10) Patent No.: US 8,614,481 B2
(45) Date of Patent: Dec. 24, 2013

(54) SEMICONDUCTOR DEVICE AND METHOD FOR FABRICATING THE SAME

(75) Inventor: Hyun Jin Lee, Seongnam-si (KR)

(73) Assignee: Hynix Semiconductor Inc., Icheon (KR)

( * ) Notice: Subject to any disclaimer, the term of this patent is extended or adjusted under 35 U.S.C. 154(b) by 34 days.

(21) Appl. No.: 13/341,304

(22) Filed: Dec. 30, 2011

(65) Prior Publication Data
US 2012/0217554 A1    Aug. 30, 2012

(30) Foreign Application Priority Data

Feb. 28, 2011   (KR) .................. 10-2011-0017801

(51) Int. Cl.
*H01L 29/94* (2006.01)
*H01L 21/336* (2006.01)

(52) U.S. Cl.
USPC .................... 257/330; 257/E21.409; 438/197

(58) Field of Classification Search
CPC ............ H01L 29/7813; H01L 29/4236; H01L 29/66734
USPC .......... 257/288, E29.242, E21.409, 304, 330, 257/647; 438/142, 197, 700
See application file for complete search history.

(56) References Cited

U.S. PATENT DOCUMENTS

| | | | |
|---|---|---|---|
| 2005/0098818 A1 | 5/2005 | Feudel et al. | |
| 2005/0179030 A1 | 8/2005 | Seo et al. | |
| 2008/0035991 A1* | 2/2008 | Lee et al. | 257/331 |
| 2008/0099785 A1* | 5/2008 | Bai et al. | 257/190 |
| 2011/0298041 A1* | 12/2011 | Renn | 257/330 |

FOREIGN PATENT DOCUMENTS

| | | | | |
|---|---|---|---|---|
| EP | 10005773 | * | 6/2010 | ............. H01L 29/66 |
| KR | 1020110000203 A | | 1/2011 | |

* cited by examiner

*Primary Examiner* — Nikolay Yushin

(57) ABSTRACT

A semiconductor device and a method for fabricating the same are provided which can increase the effective channel area and maintain a transistor characteristic. Since the semiconductor device comprises a recess filled with a gate spacer, a gate threshold voltage can be maintained even though the ion-implanting concentration of the active region is not uniform. The semiconductor device comprises: a device isolation film that defines an active region formed over a semiconductor substrate; a line-type recess with a given depth formed to be extended along a first direction to intersect at the active region; and a gate formed to be extended along a second direction to intersect at the active region, wherein a spacer including a high K material is disposed at sidewalls.

15 Claims, 10 Drawing Sheets

(a)

(b)

(a)

(b)

(a)

(b)

SEMICONDUCTOR DEVICE AND METHOD FOR FABRICATING THE SAME

CROSS-REFERENCE TO RELATED APPLICATION

The priority of Korean patent application No. 10-2011-0017801 filed on Feb. 28, 2011 the disclosure of which is hereby incorporated in its entirety by reference, is claimed.

BACKGROUND OF THE INVENTION

An embodiment of the present invention relates generally to a semiconductor device and a method for fabricating the same, and more particularly to a semiconductor device that comprises a gate spacer of a high K material and a method for fabricating the same.

A dynamic random access memory (DRAM) device includes a plurality of unit cells each having a capacitor and a transistor. The capacitor is used to temporarily store data, and the transistor is used to transfer data between a bit line and the capacitor in response to a control signal (word line). The data transfer occurs by using a semiconductor property of changing electrical conductivity depending on external conditions. A transistor has three regions of gate, source, and drain. Electric charges move between the source and drain based on the control signal at the transistor gate. The moving electric charges between the source and drain flow through a channel region having the semiconductor property.

In a conventional method for manufacturing a transistor, a gate is formed in a semiconductor substrate, and source and drain are formed by doping impurities into the semiconductor substrate on the sides of the gate. The channel region of a transistor is located under the gate between the source and drain of the transistor. The transistor having a horizontal channel region occupies a predetermined area of a semiconductor substrate. A large number of transistors are needed in a complicated or highly integrated semiconductor memory device, which often makes it difficult to reduce the total area of the semiconductor memory device.

Reducing the total area of a semiconductor memory device leads to an increased number of semiconductor memory devices manufactured per wafer, thereby improving productivity. A conventional method proposes to replace a conventional planar gate having a horizontal channel region with a recess gate in which a recess is formed in a substrate and a channel region along a curved surface of the recess by forming a gate in the recess or with a 3-dimensional transistor that increases the channel area.

BRIEF SUMMARY OF THE INVENTION

Various embodiments of the present invention are directed to providing a semiconductor device and a method for fabricating the same that can increase the effective channel area and maintain a transistor characteristic by maintaining a gate threshold voltage even though the ion-implanting concentration of the active region is not uniform while a gate spacer is buried in a recess.

According to an embodiment of the present invention, a semiconductor device comprises: a device isolation film that defines an active region formed over a semiconductor substrate; a line-type recess with a given depth formed to be extended along a first direction to intersect at the active region; and a gate formed to be extended along a second direction to intersect at the active region, wherein a spacer including a high K material is disposed at sidewalls. The semiconductor device can increase the effective channel area and maintain a transistor characteristic by maintaining a gate threshold voltage even though the ion-implanting concentration of the active region is not uniform while a gate spacer is buried in a recess.

The spacer includes at least one or more selected from a nitride film, $HfO_2$, $ZrO_2$ and $BST(Ba_{1-x}Sr_xTiO_3)$.

Two or three recesses are formed to intersect at one active region.

A portion of the recess is formed at a boundary region of the active region and the device isolation film.

The cross-sectional view of the recess includes one of a quadrangle, a semicircle and a triangle.

The first direction is perpendicular to the second direction.

The semiconductor device further comprises: an interlayer dielectric film formed over the semiconductor substrate; a contact hole formed at a region of the interlayer dielectric film where a contact plug is to be formed; and a spacer formed at a region adjacent to the contact hole in the recess disposed in the lower portion of the interlayer dielectric film.

According to an embodiment of the present invention, a method for fabricating a semiconductor device comprises: forming a device isolation film that defines an active region over a semiconductor substrate; forming a line-type recess with a given depth extended along a first direction to intersect at the active region; forming a gate extended along a second direction to intersect at the active region; and forming a spacer including a high K material at sidewalls of the gate. The method can increase the effective channel area and maintain a transistor characteristic by maintaining a gate threshold voltage even though the ion-implanting concentration of the active region is not uniform while a gate spacer is buried in a recess.

The forming-a-recess includes forming two ore three recesses to intersect at one active region.

The forming-a-recess includes forming a portion of the recess at a boundary region of the active region and the device isolation film.

The forming-a-recess includes forming the cross-sectional view of the recess to include one of a quadrangle, a semicircle and a triangle.

The second direction is perpendicular to the first direction in the forming-a-gate.

The forming-a-spacer includes: depositing a high-K material including at least one or more selected from a nitride film, $HfO_2$, $ZrO_2$ and $BST(Ba_{1-x}Sr_xTiO_3)$ over the entire surface of the semiconductor substrate; and etching back the high-K material.

The method further comprises: depositing an interlayer dielectric film over the entire surface of the semiconductor substrate; selectively etching the interlayer dielectric film and the spacer to form a contact hole; and burying a conductive material in the contact hole to form a contact plug.

The method also further comprises performing an ion-implanting process on the active region to form a junction region.

The forming-a-contact-hole includes making a spacer remain at a region adjacent to the contact hole in the recess disposed in the lower portion of the interlayer dielectric film.

The forming-a-device-isolation-film includes: forming a trench with a given depth over the semiconductor substrate; and burying an insulating film in the trench.

DESCRIPTION OF EMBODIMENTS

Exemplary embodiments of the present invention will be described in detail with reference to the attached drawings.

Figure 1:
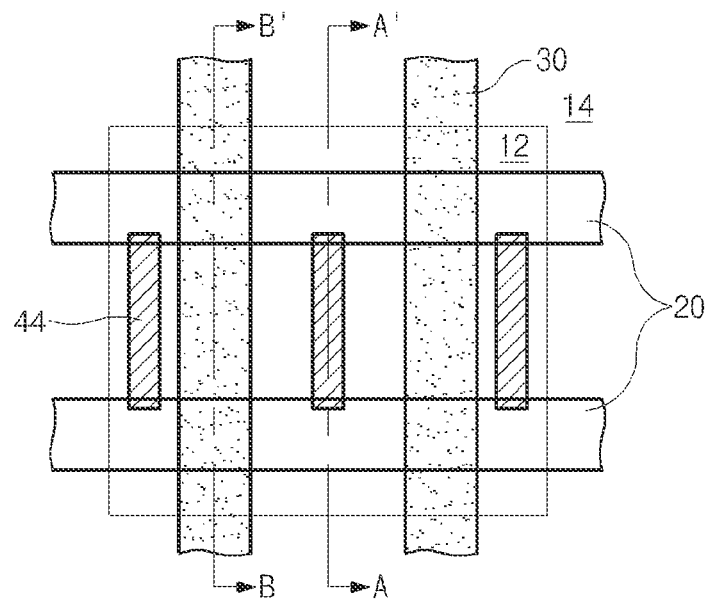
FIGS. 1 to 3 are plan views illustrating semiconductor devices according to embodiments of the present invention.
Figure 2:
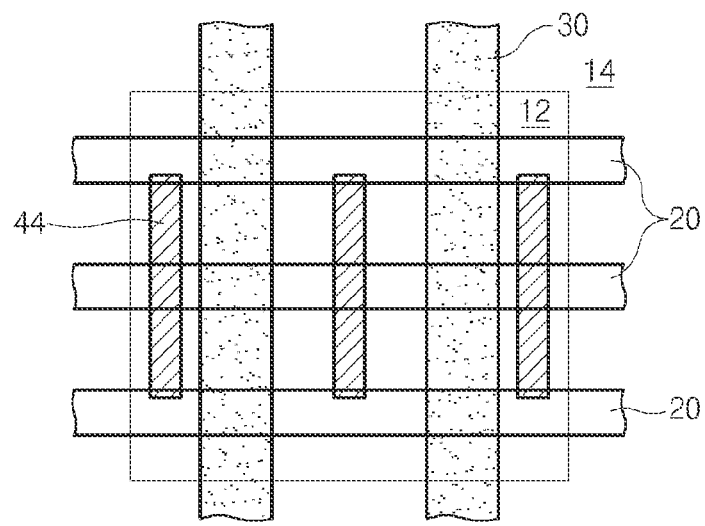
Figure 3:
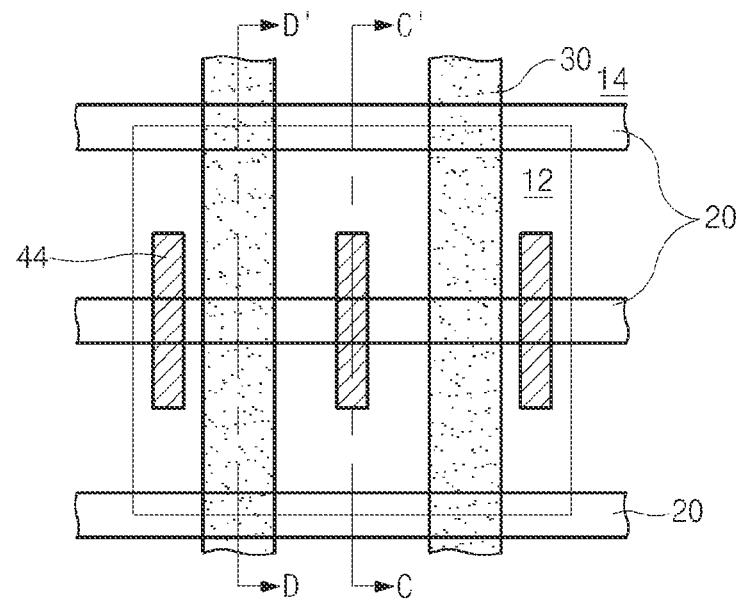

FIGS. 1 to 3 are plan views illustrating semiconductor devices according to embodiments of the present invention.

Figure 4:
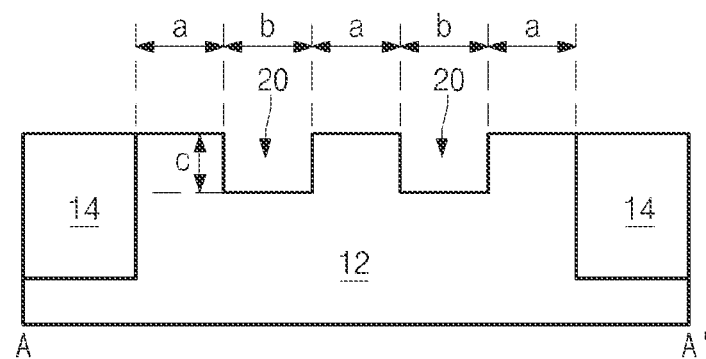
FIG. 4 is a cross-sectional view taken along A-A' and B-B' of FIG. 1.
Figure 4:
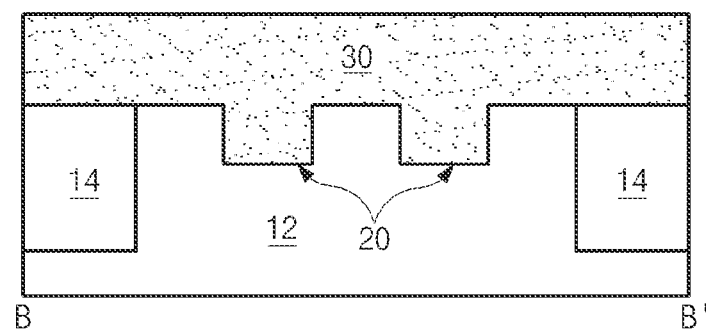

Referring to FIG. 1, an island-type active region 12 is formed over a semiconductor substrate and a device isolation film 14 that defines the active region is formed. Although one active region 12 is shown in FIG. 1 for convenience, a plurality of active regions are regularly or irregularly formed over the semiconductor device. Shallow Trench Isolation (STI) may be applied to form the device isolation film 14. As shown in FIG. 4, a trench is formed with a given depth in a portion other than where active region 12 is to be formed in the semiconductor substrate, and an insulating film such as an oxide film is formed in the trench.

With respect to the orientation of FIG. 1, two recesses 20 are formed along a horizontal direction (left to right), and two gates 30 are formed along a vertical direction (up and down) and intersect with the recesses 20 in the active region 12. The number of recesses 20 and gates 30 may be changed depending on the embodiment. It is desirable to form the recess 20 and the gate 30 so that they are orthogonal to one another. In alternative embodiments, the recess 20 and the gate 30 may be formed at other angles to one another. Contact plugs 44 are formed in regions disposed at both sides of the gate 30 in the active region. It is desirable to form only one contact plug 44 in a region disposed between two gates 30. The contact plug 44 for coupling a junction region (source/drain) formed in the active region 12 with a specific conductive layer may be one of a variety of contact plug types such as a bit line contact plug, a storage node contact plug or a landing plug.

When the recess 20 intersects with the gate 30 direction in active region 12, it is possible to form a 3-dimensional transistor and increase the effective width of a channel in proportion to the depth and the number of recesses 20, which will be described later with reference to FIG. 4.

FIGS. 2 and 3 are plan views illustrating semiconductor devices according to embodiments of the present invention.

FIG. 2 shows structures of the active region 12, the device isolation film 14 and the gate 30 that are similar to those of FIG. 1, but the embodiment in FIG. 3 shows three recesses 20 in active region 12. Depending on the area of the active region 12 and the line-width of the recess 20, three or more of the recesses 20 may be formed to intersect with gates at one active region 12. When three channels are used the total channel area is increased compared to the embodiment shown in FIG. 1.

Although the embodiment shown in FIG. 3 is similar to that of FIG. 2 in that three recesses 20 are intersecting with gates at one active region 12, it is different from that of FIG. 2 in that two of the three recesses 20 intersecting at one active region 12 are formed in a boundary region between the active region 12 and the device isolation 14. That is, since the recess 20 is formed at the edge of the active region 12, the operation of a 3-dimensional transistor can be provided in the edge of the active region 12. As a result, the embodiment of FIG. 3 has improved device characteristics in comparison with that of FIG. 2.

Figure 5:
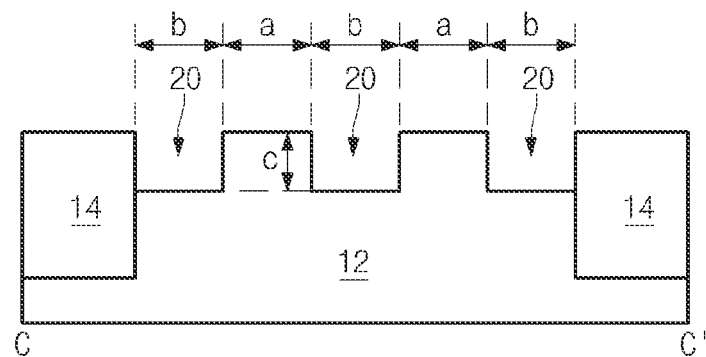
FIG. 5 is a cross-sectional view taken along C-C' and D-D' of FIG. 3.
Figure 5:
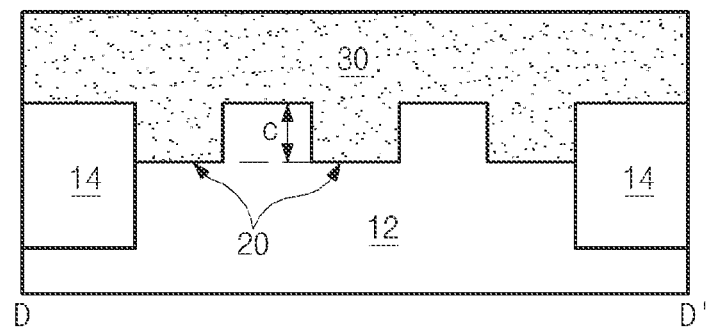

FIG. 4 is a cross-sectional view taken along A-A' and B-B' of FIG. 1, and FIG. 5 is a cross-sectional view taken along C-C' and D-D' of FIG. 3. Referring to FIGS. 4 and 5, the structure of the 3-dimensional transistor of a semiconductor device according to an embodiment of the present invention is described in more detail as follows.

Referring to (a) and (b) of FIG. 4, the device isolation film 14 that defines active region 12 is formed over a semiconductor substrate, and the two recesses 20 having a given width (b) and a given depth (c) are formed in the active region 12. The line-width of the recess 20 is defined as 'b', and the depth of the recess 20 is defined as 'c'. In an embodiment, the width of various 'a' portions on FIG. 4 is different, but for convenience of explanation, the width of 'a' portions is treated as the same in the following discussion.

In this 3-dimensional transistor, the contact surface between the gate 30 and active region 12 in a single dimension is '$3a+2b+4c$'. While '$3a+2b$' is the contact surface of the gate when the transistor is formed with a general planar gate, the contact surface is increased by the length of '$4c$', that is, by four times the depth (c) of the recess 20, in the embodiment shown in FIG. 4.

In the embodiments shown in FIG. 5, the contact surface is further increased. FIG. 5 shows cross-sectional views taken along C-C' and D-D' of FIG. 3, which shows an embodiment where three recesses 20 are formed in one active region 12 and two of the three recesses 20 are formed in edges of the active region 12. The dimensions of 'a' to 'c' are the same as those shown in FIG. 4.

In the 3-dimensional transistor shown in FIG. 5, the contact surface of the gate 30 formed in one active region 12 is '$3a+2b+6c$'. That is, in comparison with FIG. 4, when the number of recesses 20 is increased by one, the channel line-width is increased by '$2c$' as shown in FIG. 5.

In other words, the value of the increased contact surface in a 3-dimensional transistor according to an embodiment of the present invention becomes two times ($2c$) of the depth (c) of the recess 30 whenever an additional quadrangular recess 20 is formed. Thus, the channel area is increased by '$4c$' when the number of the recess 20 is two (see FIG. 4), and the channel area is increased by '$6c$' when the number of the recess 20 is three (see FIG. 5). Although a cross-sectional view of the embodiment of FIG. 2 is not shown, since the number of the recess 20 is three in one active region 12, the channel area is increased by '$6c$.'

FIGS. 6 to 10 are perspective views and cross-sectional views which show a method for fabricating a semiconductor device according to an embodiment (the example where two recesses are formed to intersect at one active region) shown in FIGS. 1 and 5. Referring to FIGS. 6 to 10, a method for fabricating a semiconductor device according to an embodiment of the present invention is described as follows.

Figure 6:
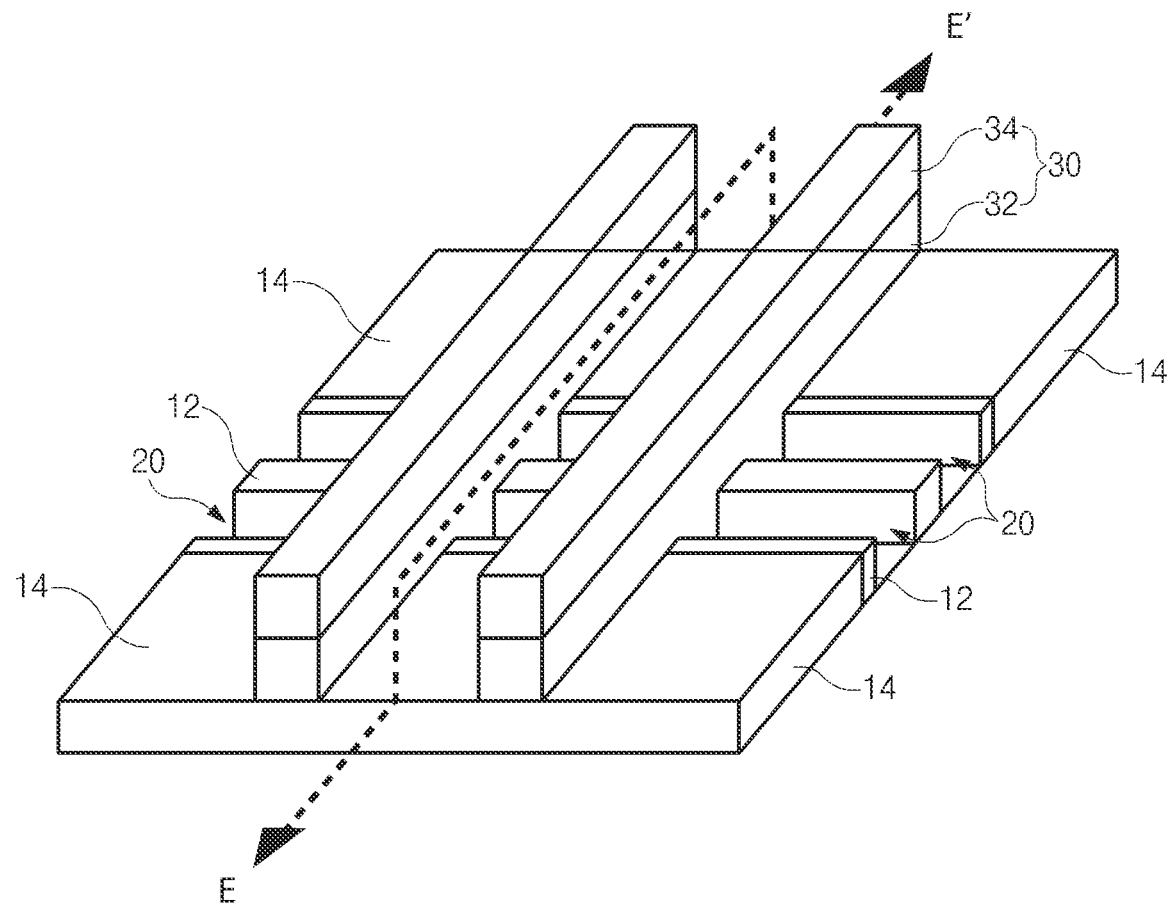
FIGS. 6 to 10 are perspective views and cross-sectional vies illustrating a method for fabricating a semiconductor device according to an embodiment of the present invention.

Referring to FIG. 6, the device isolation film 14 that defines active region 12 is formed over a semiconductor substrate. The process for forming the device isolation film 14 may be performed by the above-mentioned STI process. Thereafter, recess 20 is formed to extend along a first direction (left-right direction in FIG. 6). In various embodiments, two or more recesses 20 may be formed (see FIGS. 2 and 3), and a recess 20 may be formed in a boundary region between the active region 12 and the device isolation film 14 (see FIGS. 3 and 5).

In the same way, the line-type gates 30 are formed to extend along a second direction (up and down direction of FIG. 6). It is desirable to form the gate 30 to intersect orthogonally with the line-type recess 20. The gate 30 may include a first conductive layer 32 and a second conductive layer 34. The first conductive layer 32 may include a polysilicon layer, and the second conductive layer 34 may include a metal layer such as tungsten or titanium. Although it is not shown, a hard mask including a nitride film may be formed over the second conductive layer 34.

The process for forming a gate 30 may include depositing a polysilicon layer and a metal layer with a given thickness over the entire surface of the substrate and etching the metal layer and the polysilicon layer with a mask formed thereon to form a first conductive layer pattern 32 and a second conductive layer pattern 34.

Figure 7:
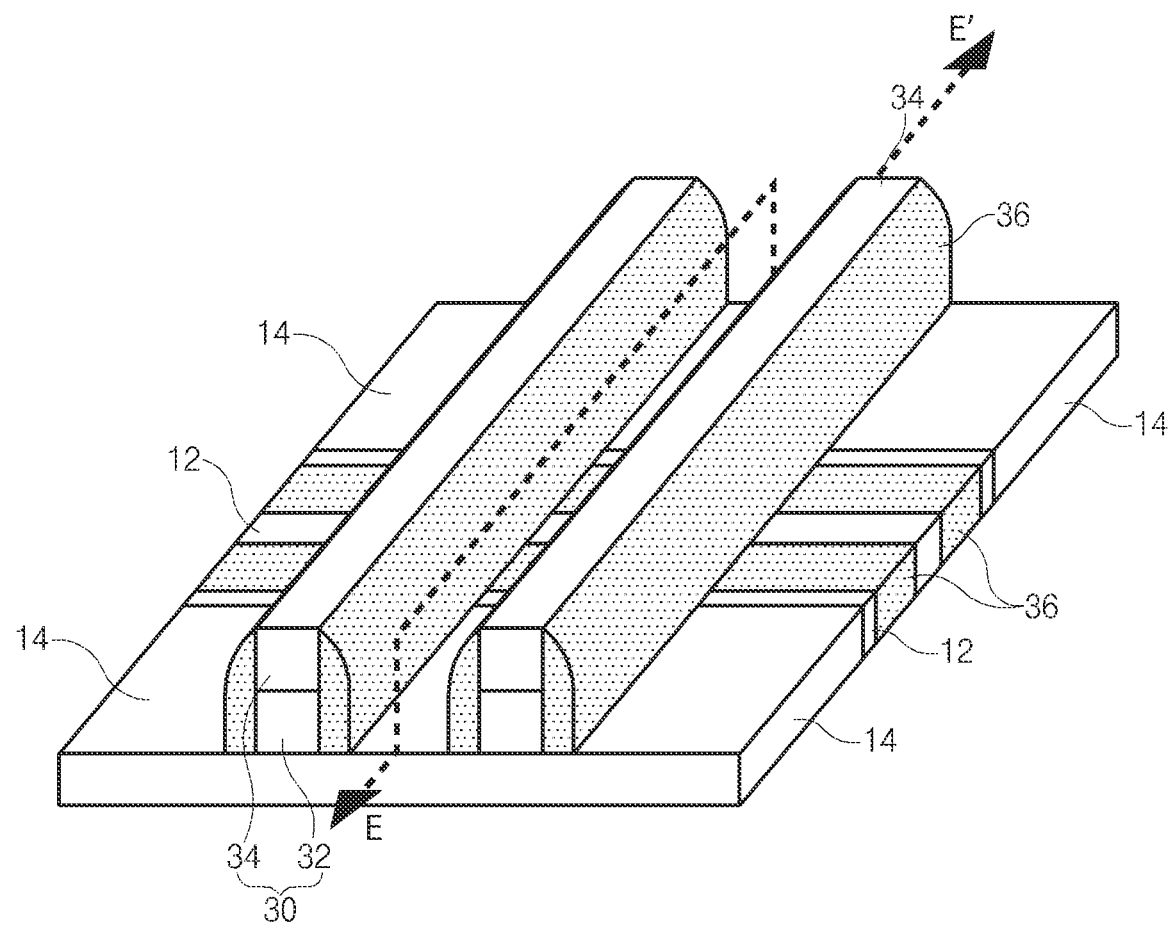

Referring to FIG. 7, a spacer 36 is formed along sidewalls of the gate 30. The spacer 36 as a high-K material may include at least one or more selected from a nitride film, $HfO_2$, $ZrO_2$ and BST ($Ba_{1-x}Sr_xTiO_3$). It is desirable that the spacer 36 is a nitride film. The line-width (or thickness) of the spacer 36 may be larger or smaller than that of the recess 20. The process for forming the spacer 36 may include depositing a high-K material, which is to be the spacer 36, over the entire surface of the substrate where the gate 30 is formed and performing an etch-back process so that the spacer 36 only remains over sidewalls of gate 30. When the depth of the recess 20 formed in the previous process is less than the thickness of spacer 36, portions of the recess 20 may be covered by the spacer 36 material. Even when the depth of recess 20 is greater than the thickness of spacer 36, a portion of the recess 20 may be covered by the spacer 36 material.

Figure 8:
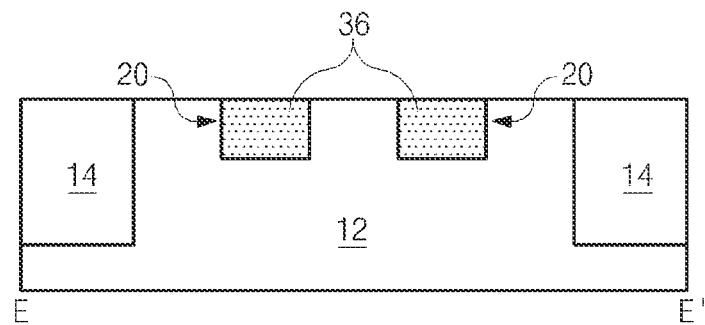

FIG. 8 is a cross-sectional view taken along E-E' of FIG. 7, which shows an embodiment where the spacer 36 material is formed in the whole recess 20.

Figure 9:
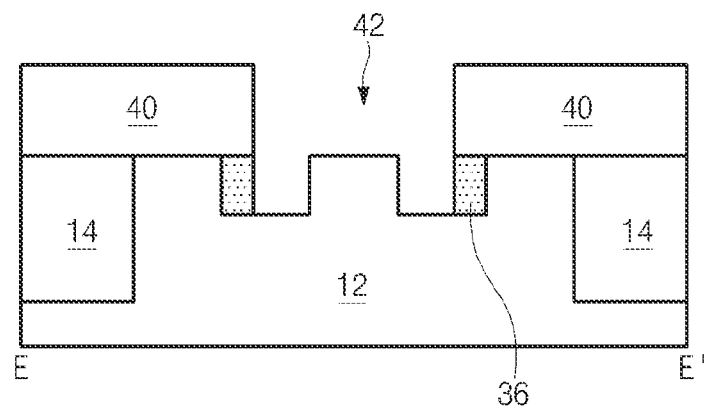

Before the process shown in FIG. 9 is performed, an ion-implanting process for forming a junction region may be performed, which is described later.

Referring to FIG. 9, an interlayer dielectric film 40 is formed over the entire surface of the semiconductor substrate where the spacer 36 is formed, and the device is planarized where the gate 30 is formed. The spacer 36 and the interlayer dielectric film 40 where a contact plug 44 (see FIGS. 1 and 10) is to be formed are selectively etched so that a contact hole 42 is formed.

Before the contact plug is formed, an ion-implanting process is performed on the active region 12 disposed in the lower portion of the contact hole 42 to form a junction region. As a result, a device having no portion where the gate 30 and the junction region are overlapped with each other is formed. In such a device, the channel region of the active region 12 is only slightly affected by the influence of the electric field by the gate 30 to reduce interference between the junction and gate.

However, when the transistor is turned on, since the channel region is electrically coupled with the junction region while an inversion layer is formed in active region 12, the transistor operates without substantial degradation.

Although the ion-implanting process may be performed once after the contact hole 42 is formed, in other embodiments, it is possible to perform the two-step ion-implanting process which includes performing an ion-implanting process at the state of FIG. 8 before forming the contact hole 42. In this implementation, while the spacer 36 is formed in the recess 20 and the sidewalls of the gate 30, the ion-implanting process for forming the junction region is performed once more. As a result, ions are sufficiently implanted only into a region where recesses 20 of the active region 12 are not formed, and ions are not sufficiently implanted into the recess 20 part filled with the spacer 36.

If the ion-implanting process described with respect to FIG. 9 is performed twice, the recess 20 has a low ion-implanting concentration, and portions of the active region 12 having no recesses 20 have a high ion-implanting concentration. As a result, a threshold voltage Vt is not uniform in the whole active region 12. However, even in this embodiment, when the transistor is turned on, since the channel region is electrically coupled with the junction region while an inversion layer is formed in the active region 12, the transistor operates without substantial degradation.

Figure 10:
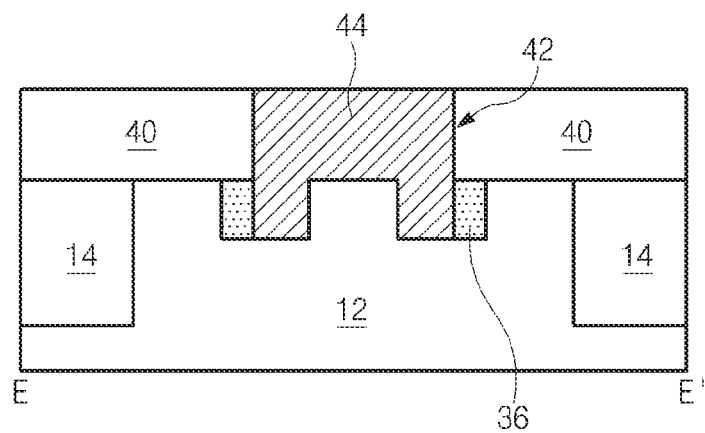

As shown in FIG. 10, a conductive material such as polysilicon or metal is formed in contact hole 42 to form a contact plug 44.

Figure 11:
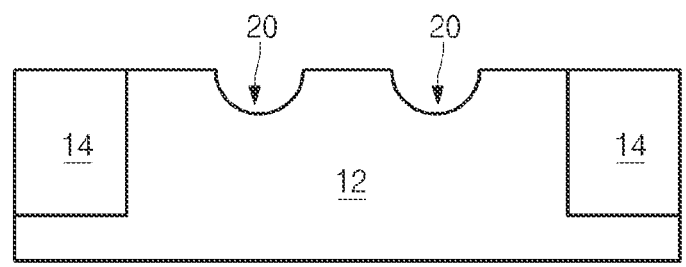
FIG. 11 is a cross-sectional view illustrating embodiments of the present invention.
Figure 11:
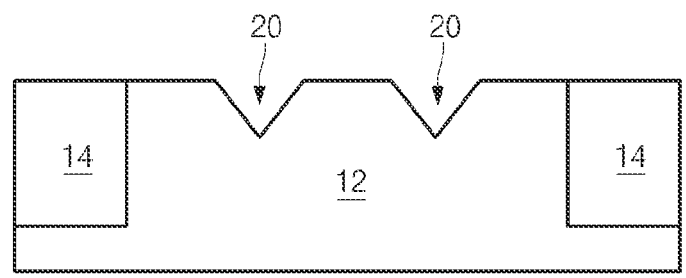

FIG. 11 is a cross-sectional view illustrating another example of the present invention. FIG. 11(a) shows an example where the cross-sectional shape of the recess 20 is a semicircle, and (b) shows an example where the cross-sectional shape of recess 20 is a triangle. Although the cross-sectional shape is a quadrangle in the embodiments shown in FIGS. 1 to 10, the cross-sectional view of the recess 20 may be various shapes, as shown in FIG. 11.

When the cross-sectional shape of recess 20 is not a quadrangle as shown in (a) or (b) of FIG. 11, the effect of increasing the effective channel surface may be reduced compared to when the cross-section of the recess 20 is quadrangle. However, since it is easier to etch the active region 12 made of silicon (Si) to have a semicircle or triangle shape rather than a quadrangle shape, the embodiments of FIG. 11 can provide an advantage of simplifying the manufacturing process.

In the embodiment where the cross-section of recess 20 has a semicircle or triangle shape as shown in (a) or (b) of FIG. 11, it is possible to perform the two-step ion-implanting process for forming a junction region. In an embodiment, ions are sufficiently implanted only into a region where the recess 20 of the active region 12 is not formed, and ions are not sufficiently implanted into the portion of recess 20 filled with the spacer 36. However, if the ion-implanting process is performed once more, when the transistor is turned on, since the channel region is electrically coupled with the junction region while an inversion layer is formed in the active region 12 operates as a transistor without substantial degradation.

As described above, the semiconductor device and the method for fabricating the same according to embodiments of the present invention can increase the effective channel surface and maintain a transistor characteristic by maintaining a gate threshold voltage even though the ion-implanting concentration of the active region is not uniform while a gate spacer is buried in a recess.

The above embodiments of the present invention are intended to illustrate and not to limit the scope of the present invention. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:
1. A semiconductor device comprising:
a device isolation film defining an active region formed over a semiconductor substrate;
a line-type recess with a given depth extending along a first direction;

a gate extending along a second direction to intersect with the line-type recess over the active region, wherein a first spacer including a high K material is disposed over sidewalls of the gate;

an interlayer dielectric film formed over the semiconductor substrate;

a contact hole formed at a region of the interlayer dielectric film where a contact plug is to be formed; and a second spacer formed over sidewalls of the line-type recess to form a portion of a sidewall of the contact hole.

2. The semiconductor device according to claim 1, wherein each of the first and second spacers includes at least one of a nitride film, $HfO_2$, $ZrO_2$, and BST ($Ba_{1-x}Sr_xTiO_3$).

3. The semiconductor device according to claim 1, wherein two or three recesses are formed to intersect with the gate over a single active region.

4. The semiconductor device according to claim 1, wherein a portion of the line-type recess is formed at a boundary region disposed over a boundary between the active region and the device isolation film.

5. The semiconductor device according to claim 1, wherein a cross-sectional shape of the line-type recess includes one of a quadrangle, a semicircle, and a triangle.

6. The semiconductor device according to claim 1, wherein the first direction is perpendicular to the second direction.

7. A method for fabricating a semiconductor device, the method comprising:

forming a device isolation film over a semiconductor substrate to define an active region bounded by the device isolation film;

forming a line-type recess with a given depth extending along a first direction;

forming a gate extended along a second direction to intersect with the line-type recess over the active region;

forming a spacer including a high K material over sidewalls of the gate;

depositing an interlayer dielectric film over an upper surface of the semiconductor substrate;

selectively etching the interlayer dielectric film and the spacer to form a contact hole; and forming a conductive material in the contact hole to form a contact plug.

8. The method according to claim 7, wherein forming the line-type recess includes forming two or three recesses intersecting the gate in one active region.

9. The method according to claim 7, wherein forming the line-type recess includes forming a portion of the line-type recess over a boundary between the active region and the device isolation film.

10. The method according to claim 7, wherein a cross-sectional shape of the line-type recess is a quadrangle, a semicircle, or a triangle.

11. The method according to claim 7, wherein the second direction is perpendicular to the first direction.

12. The method according to claim 7, wherein forming the spacer further includes:

depositing the high-K material including at least one selected from a nitride film, $HfO_2$, $ZrO_2$, and BST($Ba_{1-x}Sr_xTiO_3$), over the upper surface of the semiconductor substrate; and etching back the high-K material.

13. The method according to claim 7, further comprising performing an ion-implanting process on the active region to form a junction region.

14. The method according to claim 7, wherein forming a the contact hole includes selectively etching the spacer so that a portion of the spacer remains adjacent to the contact hole in the line-type recess.

15. The method according to claim 7, wherein forming the device isolation film further includes:

forming a trench with a given depth over the semiconductor substrate; and forming an insulating film in the trench.

\* \* \* \* \*